(12) United States Patent
Tseng et al.

(10) Patent No.: US 8,772,159 B2
(45) Date of Patent: Jul. 8, 2014

(54) METHOD OF FABRICATING ELECTRICAL CONTACT

(75) Inventors: I-Ming Tseng, Kaohsiung (TW); Tsung-Lung Tsai, Tai-Nan (TW); Yi-Wei Chen, Taichung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 137 days.

(21) Appl. No.: 13/364,289

(22) Filed: Feb. 1, 2012

(65) Prior Publication Data

US 2013/0193577 A1    Aug. 1, 2013

(51) Int. Cl.
*H01L 21/441*    (2006.01)
*H01L 29/417*    (2006.01)

(52) U.S. Cl.
USPC ............ 438/655; 438/664; 438/683; 257/751

(58) Field of Classification Search
USPC ............................ 438/581, 583, 649; 257/751
See application file for complete search history.

(56) References Cited

U.S. PATENT DOCUMENTS

| 5,998,873 | A | 12/1999 | Blair |
| 6,191,033 | B1 * | 2/2001 | Liao et al. ..................... 438/653 |
| 6,458,693 | B1 * | 10/2002 | Park et al. ..................... 438/652 |
| 6,503,803 | B2 * | 1/2003 | Todorobaru et al. .......... 438/296 |
| 6,627,527 | B1 * | 9/2003 | Wang et al. ................... 438/592 |
| 6,652,355 | B2 | 11/2003 | Wiswesser |
| 6,974,773 | B2 * | 12/2005 | Thakur et al. ................. 438/643 |
| 7,214,620 | B2 | 5/2007 | Kim |
| 8,405,131 | B2 * | 3/2013 | Yang .............................. 257/288 |
| 2005/0019991 | A1 * | 1/2005 | Ikegami ........................ 438/149 |
| 2008/0054371 | A1 | 3/2008 | Beyer |
| 2008/0242196 | A1 | 10/2008 | Marxsen |
| 2010/0040768 | A1 | 2/2010 | Dhindsa |

* cited by examiner

*Primary Examiner* — Olik Chaudhuri
*Assistant Examiner* — Nicholas Tobergte
(74) *Attorney, Agent, or Firm* — Winston Hsu; Scott Margo

(57) ABSTRACT

A method of fabricating an electrical contact comprises the following steps. A substrate having at least a silicon region is provided. At least an insulation layer is formed on the substrate, wherein the insulation layer comprises at least a contact hole which exposes the silicon region. A metal layer is formed on sidewalls and bottom of the contact hole. An annealing process is performed to form a first metal silicide layer in the silicon region nearby the bottom of the contact hole. A conductive layer covering the metal layer and filling up the contact hole is then formed, wherein the first metal silicide layer is transformed into a second metal silicide layer when the conductive layer is formed.

10 Claims, 10 Drawing Sheets

METHOD OF FABRICATING ELECTRICAL CONTACT

BACKGROUND OF THE INVENTION

1. Field of the Invention

The present invention generally relates to a structure of an electrical contact. More particularly, the invention relates to an electrical contact connecting semiconductor devices and a fabricating method thereof.

2. Description of the Prior Art

As semiconductor processes advance to very deep submicron geometries, such as 20-nm node and beyond, and with the progress of device miniaturization, junction resistance between semiconductors and external contact metals has become a critical issue; therefore, there is a strong need to invent electrical contact structures with relatively low junction resistance, which can be used to connecting semiconductors and conductive lines.

In a convention method of fabricating an electrical contact, in order to reduce junction resistance, a self-aligned silicide (salicide) process is utilized to form a metal silicide layer on the junction of metal and semiconductor layer. For example, a semiconductor device covered with a metal layer is provided first. Next, an annealing process is carried out to diffuse atoms inside the metal layer into certain regions, like silicon regions contacted with the metal layer, so that metal silicide layers is formed on the surface of the certain regions. Then, remaining metal layers are removed and another annealing process is performed. During this process, the resistivity of the metal silicide layers can be reduced. An insulation layer, which has a plurality of contact holes, is than formed on the semiconductor device so that the metal silicide layers can be exposed from the contact holes. Finally, a barrier layer and a conductive layer are deposited inside the contact holes to thereby complete a contact structure. The above-saying procedures, however, need at least two annealing processes and a removing process of the metal layer. Such complicated steps are no doubt increase cost of the manufacture and the thermal budget of the semiconductor device is over consumed.

Regarding the drawbacks described above, there is always a continuing need to develop an electrical contact and a fabricating method thereof, which can simply a fabricating process and save thermal budget of semiconductor devices from over consuming.

SUMMARY OF THE INVENTION

The main objective of the invention is to provide a structure of an electrical contact and a fabricating method thereof which can not only simplify fabricating processes but also avoid over consuming thermal budget.

In one aspect, according to one embodiment of the invention, a method of fabricating an electrical contact is provided, which comprises the following sequences. A substrate having at least a silicon region is provided. At least an insulation layer is formed on the substrate, wherein the insulation layer comprises at least a contact hole exposing the silicon region and having sidewalls and a bottom surface. A metal layer is formed on the sidewalls and the bottom of the contact hole. An annealing process is performed to form a first metal silicide layer in the silicon region nearby the bottom of the contact hole. A conductive layer covering the metal layer and filling up the contact hole is then formed, wherein the first metal silicide layer is transformed into a second metal silicide layer when the conductive layer is formed.

In another aspect, according to another embodiment of the invention, an electrical contact is provided, which comprises a substrate having at least a silicon region, at least an insulation layer on the substrate, wherein the insulation layer comprises at least a contact hole exposing the silicon region and having sidewalls and a bottom surface, a metal layer formed on the sidewalls of the contact hole, a conductive layer covering the metal layer, wherein the conductive layer fills up the contact hole, and a second metal silicide layer adjacent to the bottom of the contact hole, wherein the metal silicide layer and the metal layer have same metal components.

In sum, the invention provides an electrical contact structure and a fabricating method thereof, which can omit a process for removing the metal layer. In addition, a phase transition process and a process for depositing barrier layer are also combined to other processes. Therefore, processes for fabricating the electrical contact structure may be simplified and thermal budget of an entire semiconductor device may also be saved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings:

FIGS. 1-10 are schematic diagrams showing a method for fabricating an electrical contact according to one embodiment of the invention, wherein FIG. 1 is a schematic diagram showing a CMOS with metal gates according to one embodiment of the invention;

FIG. 2 is a schematic diagram showing a CMOS with polysilicon gates according to another embodiment of the invention;

FIG. 3 is a flow chart illustrating a fabrication process of an electrical contact according to a first exemplary embodiment of the invention;

FIG. 4 is a flow chart illustrating a fabrication process of an electrical contact according to a second exemplary embodiment of the invention; and FIGS. 5-10 are schematic diagrams showing a method for fabricating an electrical contact according to one embodiment of the invention.

Figure 1:
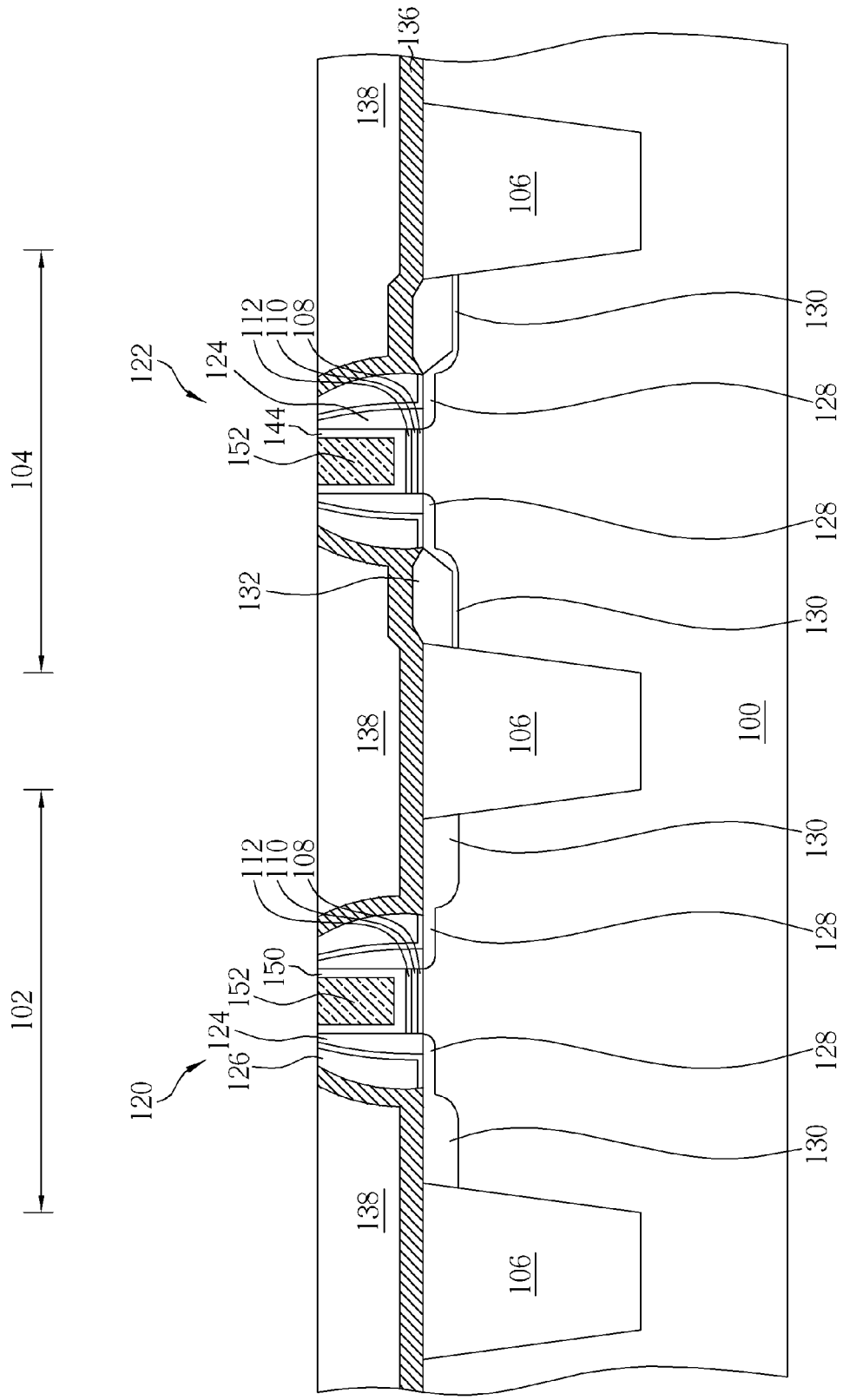

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Please refer to FIGS. 1-10. FIGS. 1-10 are schematic diagrams showing a method for fabricating an electrical contact according to one embodiment of the invention. As shown in FIG. 1, a semiconductor device is provided first, for example, a complementary metal oxide semiconductor transistor (CMOS), which is fabricated through a gate—last process accompanied with a high-k first process. A structure of which is described as follows. A substrate 100, for example, a silicon substrate, a silicon-on-insulator (SOI) or the like is provided. A first region and a second region are defined on the substrate 100, such as an NMOS region 102 and a PMOS region 104. A plurality of shallow trench isolations (STI) 106 is formed in the substrate 100 for separating the two transistor regions. A first gate structure 120 and a second gate structure 122 are formed on the NMOS region 102 and the PMOS region 104, respectively. Each sidewall of the gate structures 120, 122 have at least a spacer, such as a first spacer 124 and a second spacer 126. A lightly doped region 128 is disposed in the substrate 100 below the first spacer 124 and the second spacer 126. At least a lightly doped region and at least a source/drain region 130 are disposed between the shallow trench isolations 106, and the source/drain region 130 is not covered by the first spacer 124 and the second spacer 126. It is worth noting that an epitaxial layer 132 may be additionally formed in the source/drain region 130 within each NMOS region 102 and PMOS region 104 to thereby adjust carrier mobility in the CMOS device. In this embodiment, the epitaxial layer 132 is only fabricated in the substrate 100 on each side of the second spacer 126 within the PMOS region 104, wherein the epitaxial layer 132 preferably includes germanium silicon and may have a single layer or a multiple layers structure. In addition, because the position of the metal silicides are defined by the contact holes 140, no metal silicide exists in the source/drain region 130 at this time. A cover layer 136 is formed on the substrate 100, which may cover the first gate structure 120 and the second gate structure 122. The cover layer may be a contact etch stop layer (CESL) which has a suitable stress. Additionally, an inter layer dielectric (ILD) is on the substrate 100 and covers NMOS region 102 and PMOS region 104.

In this embodiment, the first gate structure 120 is a kind of metal gate structure which includes a high-k dielectric layer 110, a work function layer 150 and a metal layer 152. The second gate structure 122 is also a metal gate which structure is similar to the first gate structure 120. The only difference between the two gates 120, 122 is that the work function layers 150 and 144 are an N-type work function layer and a P-type work function layer respectively. That is to say, the N-type work function layer has relatively small work function value. In the present invention, the work function layers 144 and 150 are preferably chosen from rare earth metal oxides, but are not limited thereto. According to another embodiment, a cover layer 112 and a dielectric layer 108 may be formed on and below the high-k dielectric layer 110, respectively and the composition of which may be of dielectric material, such as metal oxide or metal nitride. A barrier layer (not shown) may be located between the work function layers 144 and 150, and the metal layer 150 respectively, to prevent atoms from diffusing from the metal layer 152. In addition, the high-K dielectric layer 110 described above includes $HfO_2$, $HfSiO_4$, $HfSiON$, $Al_2O_3$, $La_2O_3$, $Ta_2O_5$, $Y_2O_3$, $ZrO_2$, $SrTiO_3$, $ZrSiO_4$, $HfZrO_4$, strontium bismuth tantalate (SBT), lead zirconate titanate (PZT), or barium strontium titanate (BST), but is not limited thereto.

Figure 2:
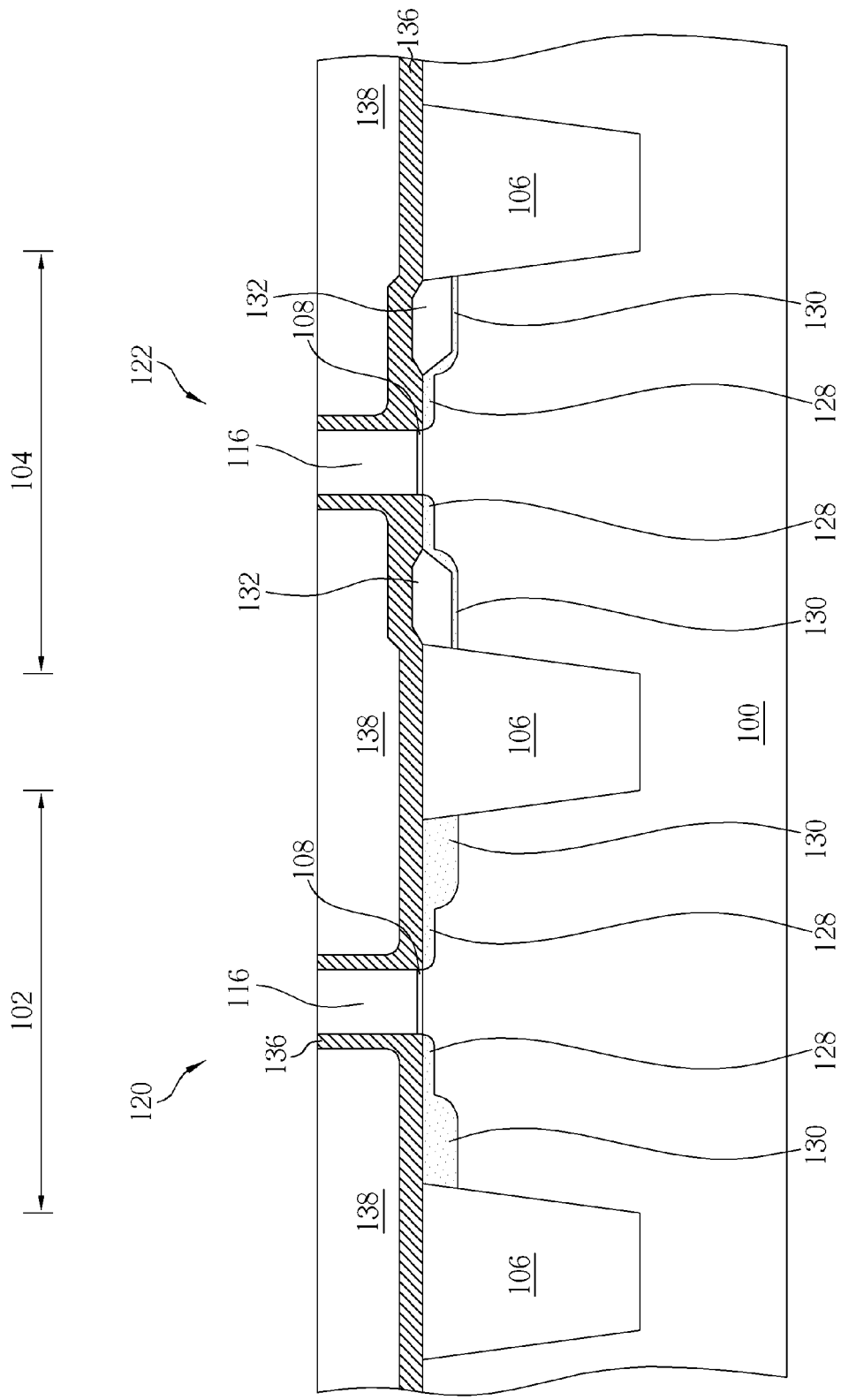

According to the preceding paragraph, a CMOS, fabricated through gate-last processes is provided, which is not the only kind of semiconductor devices suitable for the invention. The semiconductor device may also be a CMOS with polysilicon gate or a CMOS fabricated through gate-first processes. As shown in FIG. 2, FIG. 2 is a schematic diagram showing a CMOS with polysilicon gates according to another embodiment of the invention. A structure of which is similar to FIG. 1, but the cover layer 136 directly covers and contacts the gate structures 120 and 122 in this case. Only a dielectric layer 108, e.g. silicon dioxide, and a polysilicon layer 116 are in the gate structures. In addition, the dielectric layer 108 may be replaced with the high-k dielectric layer 100 as described above.

Figure 3:
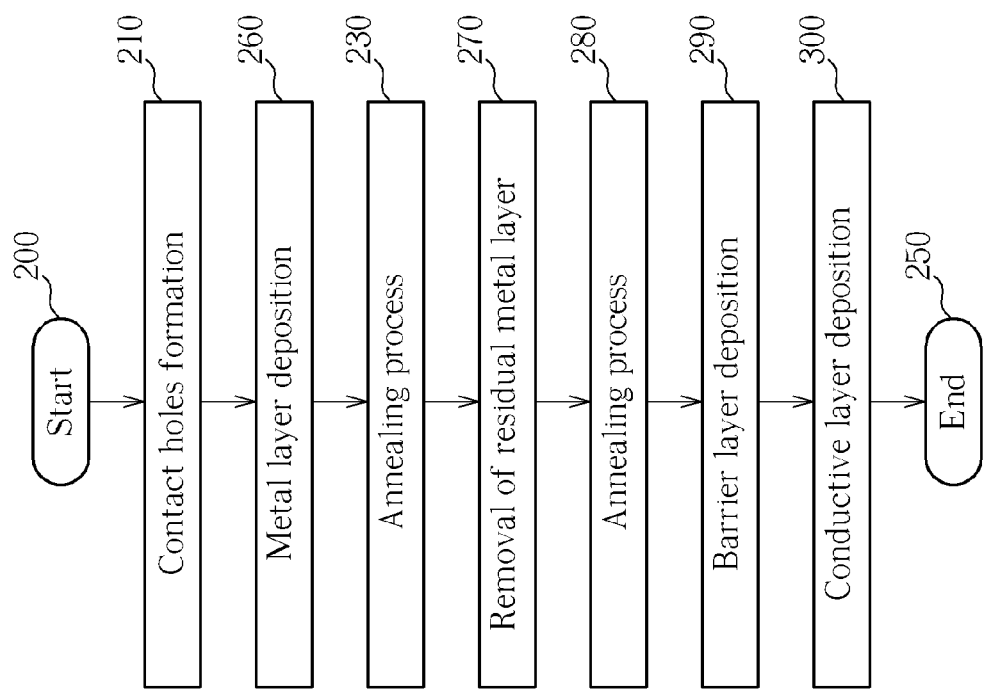
Figure 4:
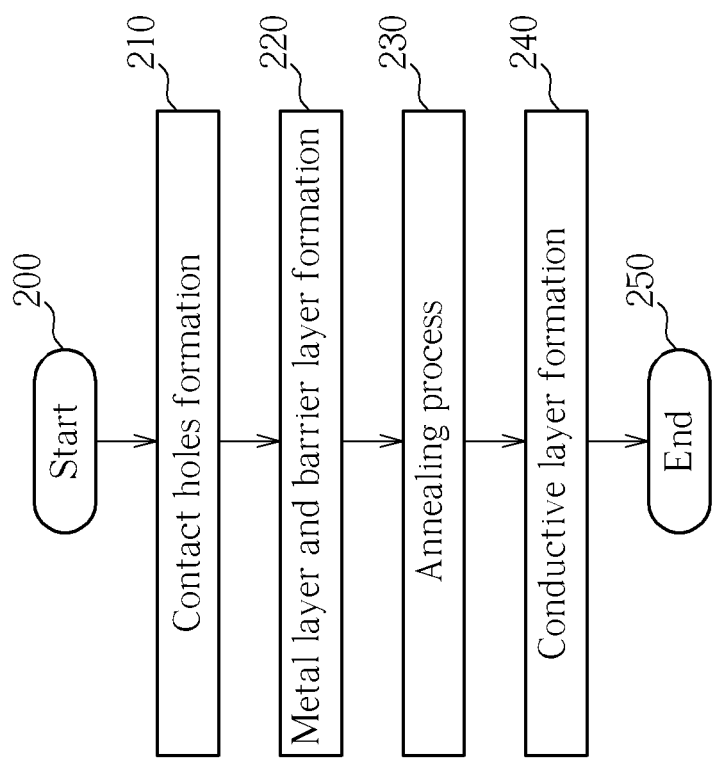

FIG. 3 is a flow chart illustrating a fabrication process of an electrical contact according to a first exemplary embodiment of the invention. FIG. 4 is a flow chart illustrating a fabrication process of an electrical contact according to a second exemplary embodiment of the invention. Please refer to FIG. 3. In this embodiment, a step 200 is performed first to obtain semiconductor devices as shown in FIG. 1 or FIG. 2. Then, a step 210 is performed, so that a plurality of contact holes 140 is formed inside the ILD 138 via a photolithography and an etching process. The positions of the contact holes 140 correspond to the areas of subsequent metal silicide. A self-aligned silicide (salicide) process is then carried out to form a metal silicide in the substrate 100. As illustrated in steps 260, 230, 270 and 280, a metal layer 160 is first filled into the contact holes 140 where it covers certain regions of the device. A annealing process, such as rapid thermal annealing (RTA), is carried out to diffuse atoms inside the metal layer 160 into the certain regions, so that a metal silicide layer is formed near each contact hole 140. Then, the remaining metal layers 160 are removed and another annealing process, such as rapid thermal annealing (RTA), is performed. During this process, the resistivity of the metal silicide can be reduced. Finally, a barrier layer 162 and a conductive layer 180 are deposited inside the contact hole 140; a contact structure 170 is therefore completed. According to the second exemplary embodiment, this embodiment provides a step 220 which is substantially the same as a combination of the steps 260 and 290, when compared with the flow chart of FIG. 4. And a step 240 is provided, which is the same as a combination of the steps 280 and 300. A step 270 showed in FIG. 3 is also omitted in this embodiment. That is to say, the second exemplary embodiment omits a process for removing metal layer 160 and cancels additional processes for phase transition and depositing the barrier layer 162. Therefore, a fabrication process for an electrical contact can be further simplified and the thermal budget will not be over consumed.

Figure 5:
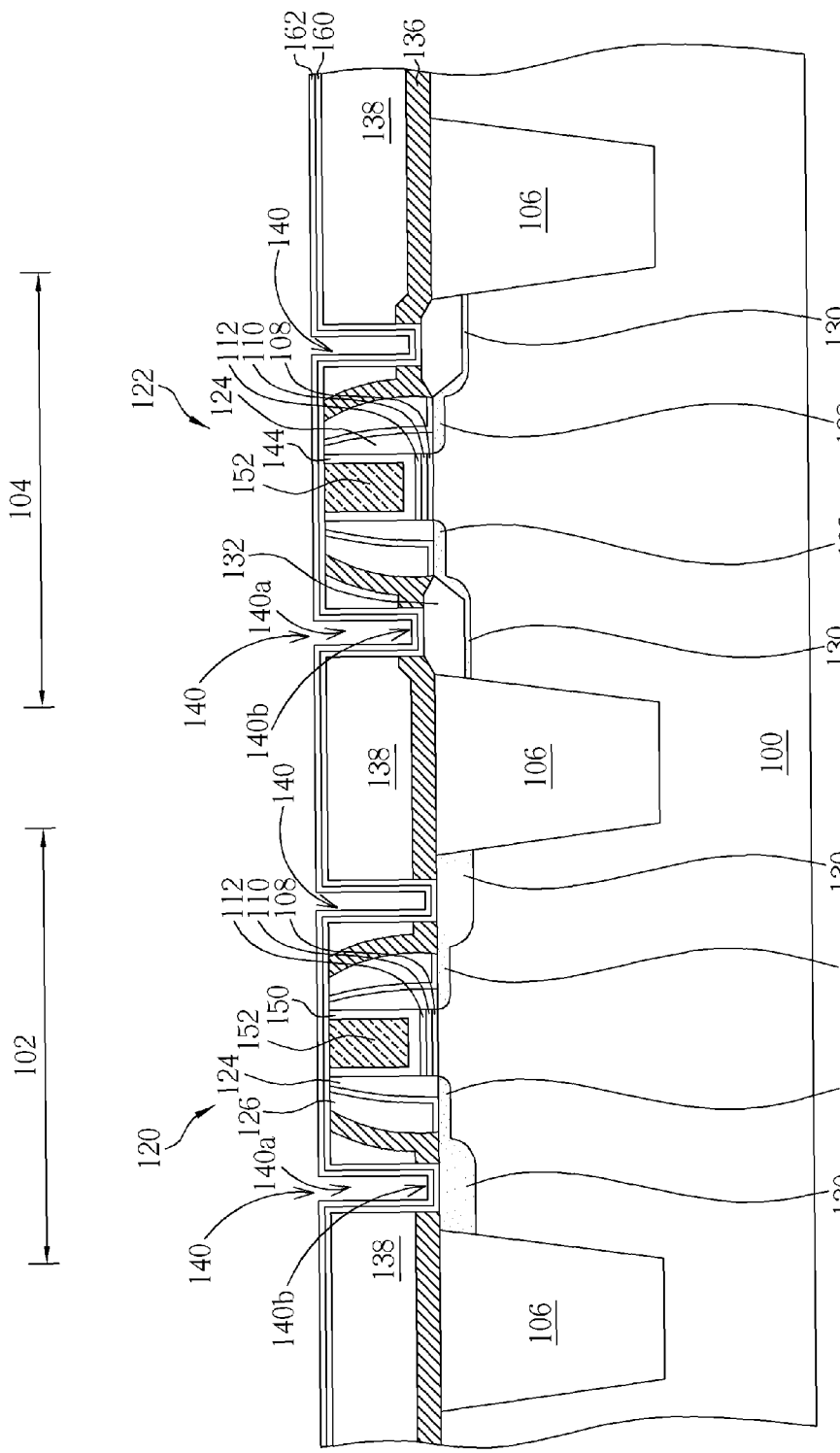

FIGS. 5-10 are schematic diagrams showing a method for fabricating an electrical contact according to the second exemplary embodiment of the invention. The specific technique features according to the invention will be described clearly in the following sequences. As shown in FIG. 5, at least a contact hole 140 is formed inside the ILD 138 to expose a related silicon region. In this case, the silicon region refers to source/drain region 130. According to another embodiment, the silicon region may refer to any semiconductor region exposed by the contact hole 140. For example, the semiconductor region may be doped or un-doped monocrystalline silicon or polycrystalline silicon, wherein dopants include phosphor, arsenic, boron, germanium or a combination of which, but are not limited to. Then, a metal layer 160 deposition process, like a radio frequency physical vapor deposition (RFPVD) process, is carried out to form a metal layer 160 on the sidewalls 140a and a bottom surface 140b of the contact hole 140. In addition, the metal layer 160 is preferably approximately 150 angstrom thick. An annealing process may be further performed in the subsequent process to correspondingly increase conductivity of the silicon region. A barrier layer 162, like Ti/TiN, Ta/TaN, or other metal nitride with similar properties, may further cover the metal layer 160 to prevent electromigration generated by the conductive layer 180 (not shown). In addition, the barrier layer 162 may be replaced with an adhesive layer (not shown) or a protective layer (not shown) to improve the adhesivity between the conductive layer 180 and the metal layer, or to prevent the metal layer 160 from oxidizing. In this case, since the metal layer 160 is already covered by the barrier layer 162, no extra barrier layer 162 is needed to be formed on the metal layer 160. Additionally, the metal layer 160 may include tungsten, aluminum, copper, titanium, tantalum, niobium, erbium, molybdenum, cobalt, nickel, platinum or alloys of which and the barrier layer 162 includes TiN, TaN, Ti/TiN or Ta/TaN, but are not limited thereto.

Figure 6:
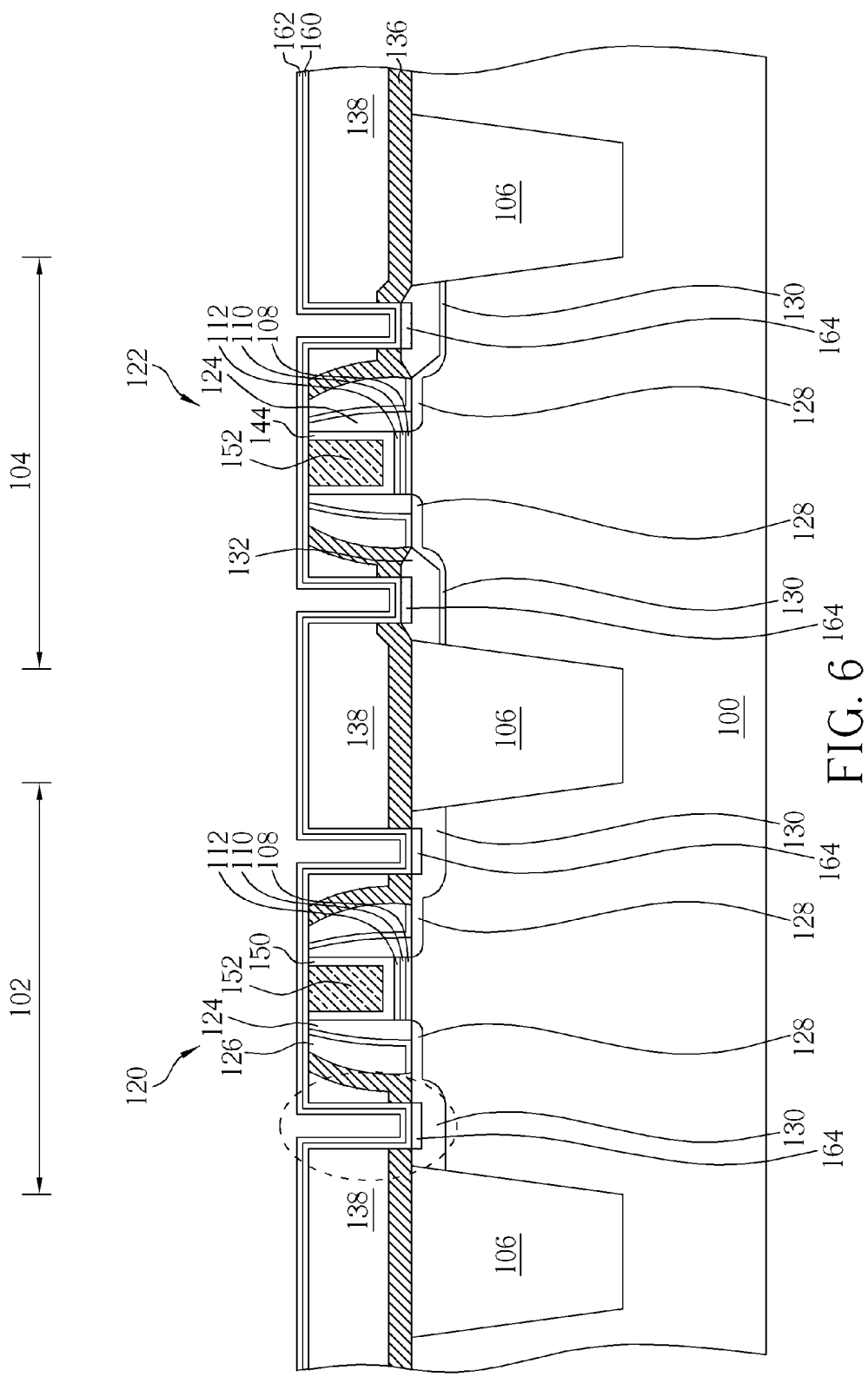

Please refer to FIG. 6. In the following processes, metal silicides will be formed in the silicon regions and the fabricating processes of which are described therein. First, an annealing process, such as a rapid thermal annealing (RTA), with a temperature inferior to 350° C. is carried out, so that metal atoms inside the metal layer 160 may enter or diffuse into the silicon region, e.g. the source/drain region 130, or the silicon atoms inside the source/drain region 130 may enter or diffuse into the metal layer 160. As a result, a first metal silicide layer 164 is formed nearby the bottom 140b of the contact hole 140. It should be noted that the annealing temperature described above may be higher than 350° C., according to another embodiment. In some cases, because the conductivity of the first metal silicide layer 164 is not low enough, another annealing process can be performed in a subsequent process.

Figure 7:
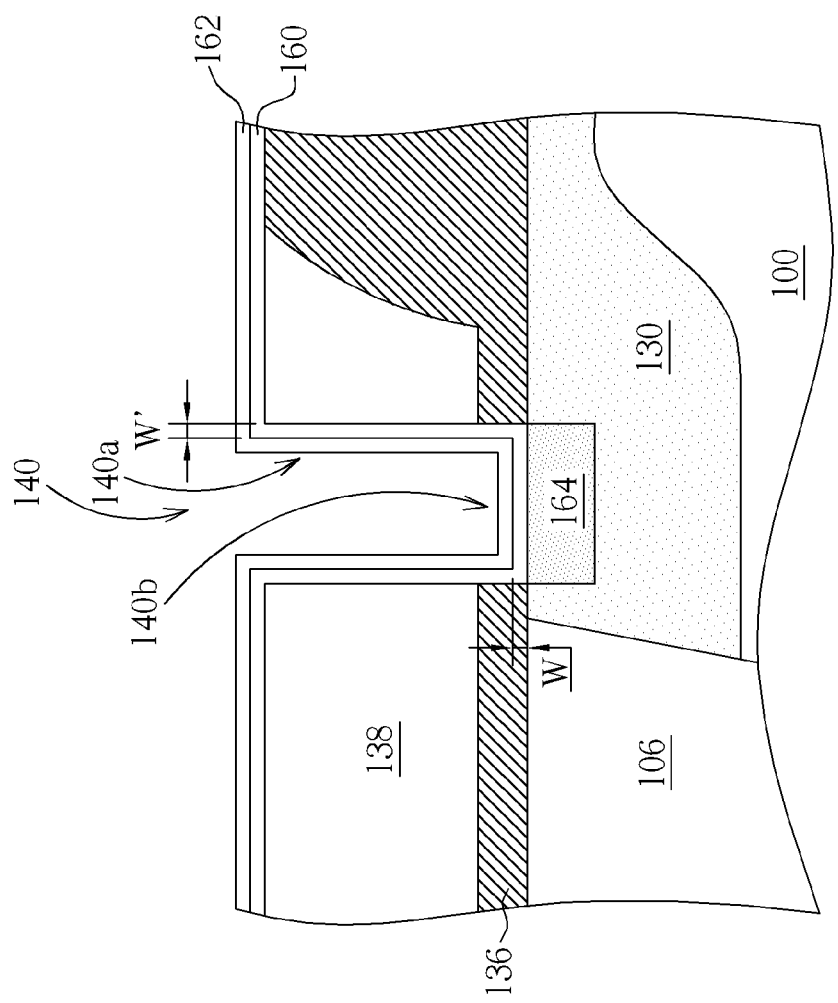
Figure 8:
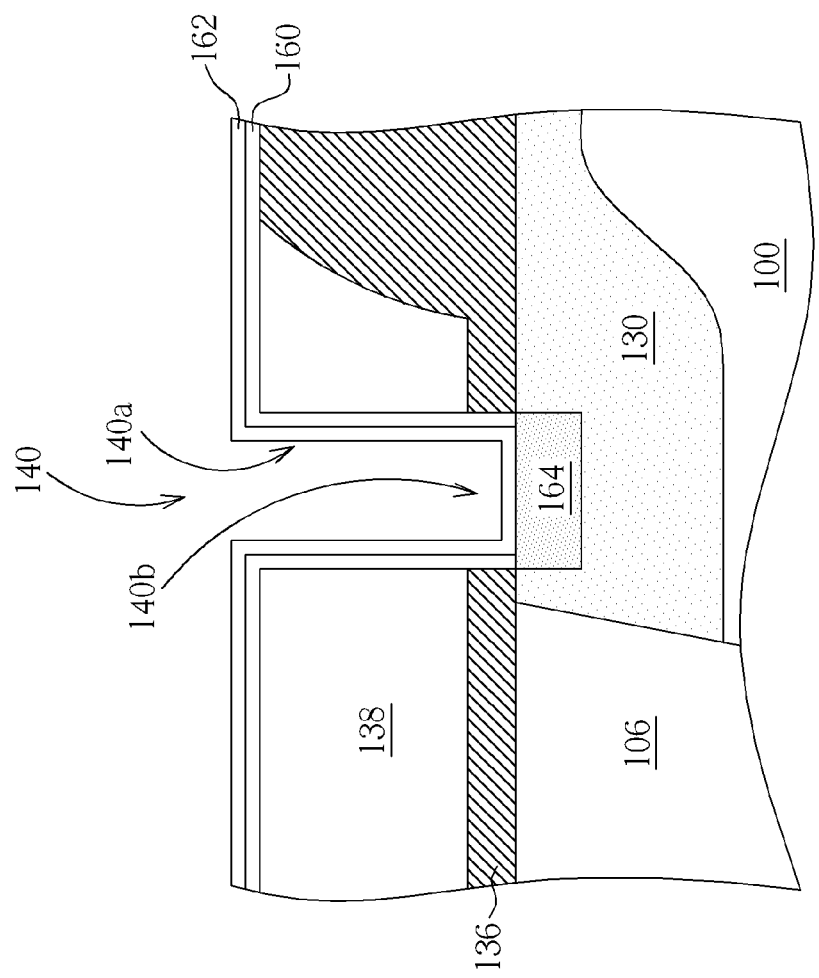

In addition, a film thickness of the metal layer 160 and processing parameters, such as time and temperature, may further be modified in order to meet the needs of a variety of products. That is to say, the thickness of the metal layer 160 near the bottom 140b of the contact hole 140 may be thicker, thinner, or even reduced to zero in different embodiments. Please refer to FIG. 7 and FIG. 8. Both of these pictures are schematic enlarged diagrams showing an encircled region depicted in the FIG. 6. As shown in FIG. 7, in this embodiment, the thickness of the metal layer 160 near the bottom 140b is reduced after performing the above-described annealing process. Therefore, the thickness W of the metal layer 160 is smaller than the thickness W' of the metal layer 160 on the sidewalls 140a. According to FIG. 8, however, the entire metal layer 160 near the bottom 140b of the contact hole 140 may disappear under appropriate processing parameter; therefore, the first metal silicide layer 164 near the bottom 140b may substantially contact the barrier layer 162, if the barrier layer 162 covering the metal layer 160 is formed before the annealing process. Additionally, the regions where the first metal silicide layer 164 exists are approximately corresponding to the regions exposed by the contact holes 140, that is to say, the first metal silicide layer 164 is on a surface of the silicon region and adjacent to the bottom 140b of the contact hole 140. It should be noted that, according to each exemplary embodiment, residues of the metal layer 160 are not removed after the annealing process; therefore, the metal layer 160, which is formed during a self-aligned silicide (salicide) process, must remain on the sidewalls 140a of the contact hole 140.

Figure 9:
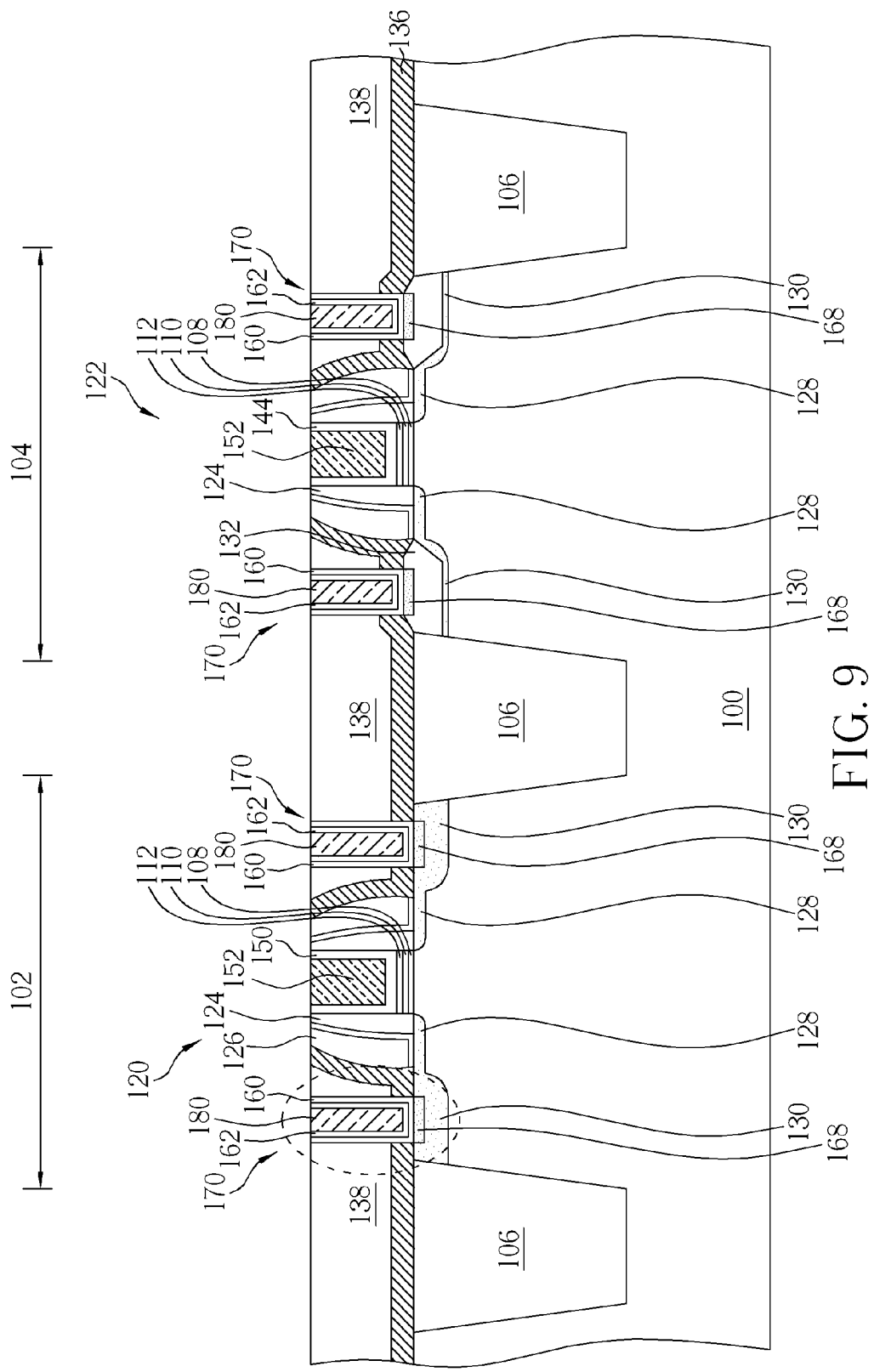

As shown in FIG. 9, a deposition and a planarizing processes a performed, a conductive layer 180 is formed to fill up each contact hole 140. The fabricating processes of these are described as follows. First, a deposition process of a conductive material is performed, such as tungsten deposition, to deposit a conductive layer 180 covering the ILD 138. According to the second exemplary embodiment, since the temperature of the annealing process is approximately 400° C., the first meal silicide layer 164 can be a transition to a second metal silicide layer 168, which has relatively high conductivity, during the annealing process (may be deemed as a phase transition process); for example, from a solid phase of $Ni_2Si$ to a solid phase of NiSi. This second exemplary embodiment integrates the phase transition process with the conductive layer 180 deposition so that no additional annealing process needs to be carried out before performing the conductive layer 180 deposition contrary to the first exemplary embodiment. Finally, a planarizing process is performed, such as a chemical mechanical polishing (CMP) process, to planarize the conductive layer 180 and remove the metal layer 160 and the barrier layer 162 on the ILD 138. In addition, the conductive layer 180 is not limited to tungsten; it may further comprise aluminum, titanium, tantanum, niobium, molybdenum, copper, alloys of above, or other suitable conductive material.

Figure 10:
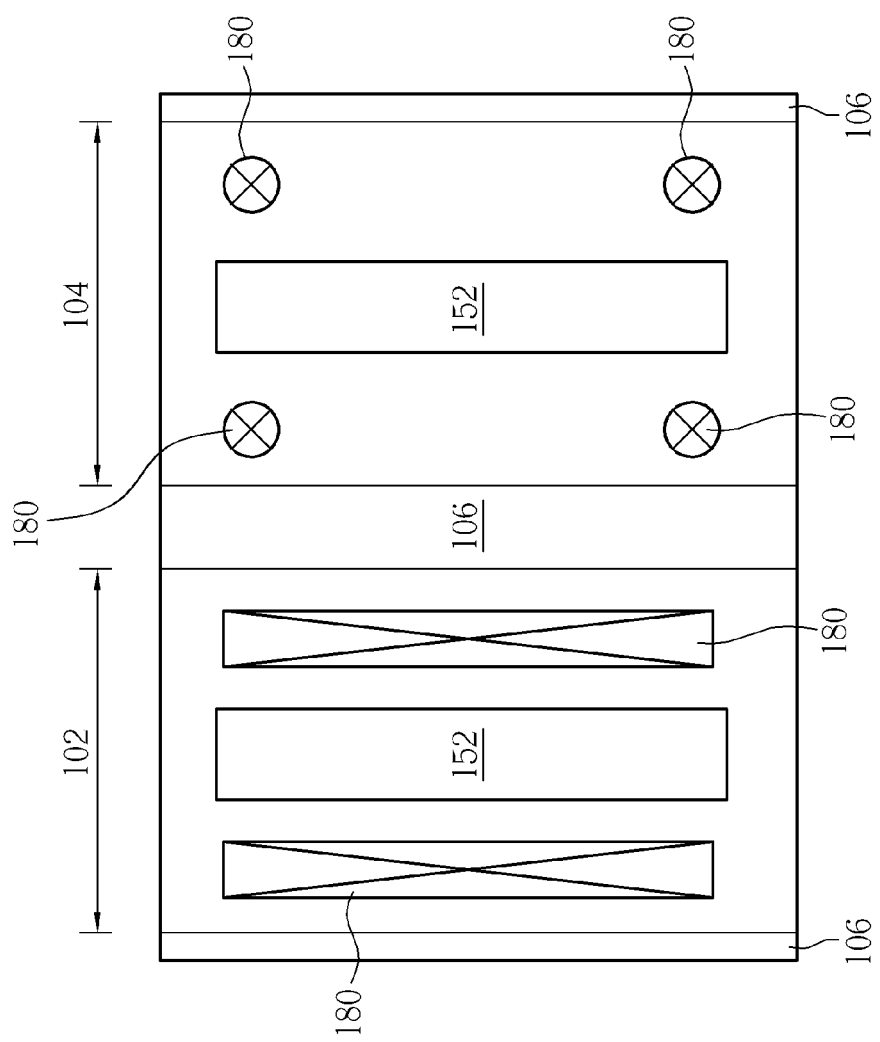

Please refer to FIG. 10, which is a schematic top-view showing a layout of the contact structure 170 encircled in the FIG. 9. According to the invention, the layout of the contact structure 170 may be of a plug shape or a slot shape. In this embodiment, each of the contact structures 170 within the NMOS region 102 has a hole with a slot shape, and each of the contact structures 170 within the PMOS region 104 has a hole with a plug shape. That is to say, each contact structure 170 within the NMOS region 102 belongs to a slot contact (slot contact hole), while each contact structure 170 within the PMOS region 104 belongs to a plug contact. The layout described above, should however not be construed in a limited sense. Depending on different requirements, each NMOS region 102 and PMOS region 104 may have slot contacts or plug contacts. For example, the contact structures 170 locating on left side and right side of the NMOS region 102 may be slot contacts and plug contacts respectively.

According to each exemplary embodiment, the CMOS device, which is fabricated through a gate-last process accompanied with a high-k first process is provided; the CMOS may however be replaced with another type of semiconductor device, which is fabricated through a gate-last process and accompanied with a high-k last process. In addition, semiconductor devices suitable for applying in the invention should not be restricted to the CMOS devices with metal gates, which may be further replaced by other substantially equivalent semiconductor devices in IC. For example, the electrical contact may be also connected to devices like NMOS, PMOS, semiconductor resistor, diode device, photosensitive device, bipolar junction transistor (BJT) or the like. That is to say, the silicon regions located in each device can be connected to the respective electrical contact. Hence, signals can be transmitted between the devices and an external circuit.

To summarize, the present invention provides an electrical contact structure 170 and the fabricating method thereof, which can omit a process of removing the metal layer 160. In addition, a phase transition process and a process for depositing barrier layer 162 are also combined to other processes. Therefore, processes for fabricating the electrical contact structure 170 may be simplified and the thermal budget of an entire semiconductor device may also be saved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating an electrical contact, comprising:
   providing a substrate having at least a silicon region;
   forming at least an insulation layer on the substrate, wherein the insulation layer comprises at least a contact hole exposing the silicon region and having sidewalls and a bottom surface;
   forming a metal layer on the sidewalls and the bottom of the contact hole;
   performing an annealing process to form a first metal silicide layer in the silicon region nearby the bottom of the contact hole; and
   forming a conductive layer covering the metal layer and filling up the contact hole, wherein the first metal silicide layer is transformed into a second metal silicide layer when forming the conductive layer, wherein a temperature of the annealing process is lower than a temperature applied in a step for forming the conductive layer.

2. The method of fabricating the electrical contact according to claim 1, wherein a thickness of the metal layer adjacent to the bottom face is reduced simultaneously when performing the annealing process.

3. The method of fabricating the electrical contact according to claim 1, wherein the metal layer adjacent to the bottom surface disappears simultaneously when performing the annealing process.

4. The method of fabricating the electrical contact according to claim 1, wherein the temperature of the annealing process is lower than 350° C.

5. The method of fabricating the electrical contact according to claim 1, wherein the second metal silicide layer and the metal layer have same metal components.

6. The method of fabricating the electrical contact according to claim 1, wherein the first metal silicide layer has larger resistivity than the second metal silicide layer.

7. The method of fabricating the electrical contact according to claim 1, wherein the contact hole is a slot contact hole.

8. The method of fabricating the electrical contact according to claim 1, wherein the annealing process is a rapid thermal annealing process.

9. The method of fabricating the electrical contact according to claim 1, after forming the metal layer and before performing the annealing process, further comprising:
   forming a barrier layer on the metal layer.

10. The method of fabricating the electrical contact according to claim 1, wherein the silicon region comprises monocrystalline silicon or polysilicon and comprises phosphor, arsenic, boron, germanium or a combination thereof.

* * * * *